United States Patent
Sanjeevarao et al.

(10) Patent No.: US 11,049,539 B1
(45) Date of Patent: Jun. 29, 2021

(54) MAGNETORESISTIVE RANDOM ACCESS MEMORY (MRAM) WITH OTP CELLS

(71) Applicant: NXP USA, Inc., Austin, TX (US)

(72) Inventors: Padmaraj Sanjeevarao, Austin, TX (US); Jon Scott Choy, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/861,562

(22) Filed: Apr. 29, 2020

(51) Int. Cl.
*G11C 11/16* (2006.01)
*G11C 17/18* (2006.01)
*G11C 17/16* (2006.01)

(52) U.S. Cl.
CPC ...... *G11C 11/1675* (2013.01); *G11C 11/1655* (2013.01); *G11C 11/1657* (2013.01); *G11C 11/1659* (2013.01); *G11C 17/165* (2013.01); *G11C 17/18* (2013.01)

(58) Field of Classification Search
CPC ............ G11C 11/1675; G11C 11/1656; G11C 11/1657; G11C 17/165; G11C 17/18
USPC ......................................................... 365/96
See application file for complete search history.

(56) References Cited

U.S. PATENT DOCUMENTS

| | | | |
|---|---|---|---|
| 8,576,602 B2 | 11/2013 | Chung | |
| 9,165,631 B2 | 10/2015 | Kim et al. | |
| 9,245,610 B2 | 1/2016 | Kim et al. | |
| 9,614,144 B1 | 4/2017 | Annunziata et al. | |
| 9,805,816 B2 | 10/2017 | Jan et al. | |
| 2014/0071740 A1 | 3/2014 | Kim et al. | |
| 2015/0103586 A1 | 4/2015 | Kim et al. | |
| 2016/0293268 A1* | 10/2016 | Jan | G11C 11/161 |

OTHER PUBLICATIONS

U.S. Appl. No. 16/710,830, Roy, Anirban: "Magnetoresistive Random Access Memory (MRAM) With OTP Cells", Notice of Allowance, dated Sep. 17, 2020, 20 pages.
Jan et al.: "Demonstration of an MgO Based Anti-Fuse OTP Design Integrated With a Fully Functional STT-MRAM at the Mbit Level", 2015 Symposium on VLSI Technology Digest of Technical Papers, pp. T164-T165.
Kilopass, "SoC for IOT: Antifuse NVM for Security and Low Power", Mar. 2015, pp. 1-25.
U.S. Appl. No. 16/710,830, Roy, Anirban: "Magnetoresistive Random Access Memory (MRAM) With OTP Cells", filed Dec. 11, 2019.

* cited by examiner

*Primary Examiner* — Xiaochun L Chen (57) ABSTRACT

A magnetoresistive random access memory (MRAM) array has a corresponding MRAM cell, including a Magnetic Tunnel Junction (MTJ), at an intersection of each row and column. A first row of the array is configured as a single one-time-programmable (OTP) row, wherein a first MRAM cell in a first column is connected to a second MRAM cell in a second column. A first MTJ of the first MRAM cell is connected to a first bit line of the first column, and a second MTJ of the second MRAM cell is not connected to a second bit line of the second column. During a write to the first MRAM cell, write circuitry is configured to connect the first and second bit lines and the corresponding source lines such that the select transistors in the first and second MRAM cells are connected in parallel to drive a write current through the first MTJ.

20 Claims, 5 Drawing Sheets

MAGNETORESISTIVE RANDOM ACCESS MEMORY (MRAM) WITH OTP CELLS

BACKGROUND OF THE INVENTION

Field of the Invention

This invention relates in general to a Magnetoresistive Random Access Memory (MRAM) and more specifically to an MRAM with OTP cells.

Background

A Magnetoresistive Random Access Memory (MRAM) is a memory whose memory cells store information using magnetic states. With some MRAM, nonvolatile data can be stored and cells can be written multiple times over the life of the memory.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an MRAM includes an array of MRAM cells that can be utilized as reprogrammable MRAM cells or as one-time programmable (OTP) devices. An MRAM is arranged in rows (along word lines) and columns (along bit line/source line pairs), in which the intersection of each row (word line) and column (bit line/source line pair) has a corresponding MRAM cell having a select transistor and a magnetic tunnel junction (MTJ). In some embodiments, some rows of the MRAM array can be configured as OTP rows while other rows of the MRAM array are used as regular MRAM rows. In other embodiments, the rows of the MRAM array are only configured as OTP rows without any regular MRAM rows.

In one embodiment, within an OTP row, a plurality of columns (having corresponding bit lines and source lines) of the MRAM array are directly connected together such that the select transistors of multiple columns are coupled in parallel for a write operation. In doing so, the MTJ of one of the plurality of columns is used as an OTP device for the OTP row, while the remaining MTJs in the other columns of the OTP row are "removed". During an OTP write operation to the OTP row, the bit lines of the plurality of columns are tied together and the source lines of the plurality of columns are tied together. In this manner, the MTJs which are used as OTP devices in the OTP row may be "blown" during an OTP write with lower voltage requirements due to a stronger effective select transistor created by the parallel select gates of the plurality of columns (which may lower the effective select gate impedance, reducing the parasitic resistance on the load line during the OTP write).

As used herein, when an MTJ is used as an OTP device, the tunnel dielectric layer of the MTJ of the cells are blown during an OTP mode write to provide a very low permanent resistance that is distinguishable from the resistance of an unblown cell, regardless of the magnetic state of the cell. Therefore, blowing the tunnel dielectric refers to destroying the tunnel dielectric in an attempt to create a short across the tunnel dielectric, thus resulting in the very low permanent resistance. In a non-OTP write mode, the direction of magnetization of the free layer of the MTJ is set to store a particular logic value (corresponding to a high resistive state or a low resistive state). During a non-OTP mode write, the dielectric tunnel layers of the cells are not blown. In some embodiments, the MRAM has two read modes. One read mode is for reading the OTP cells of an OTP row of the MRAM array and the other is for reading the magnetic states of non-OTP cells. In some embodiments, the different modes involve providing different reference resistances to sense amplifiers during a read operation of the MRAM.

Figure 1:
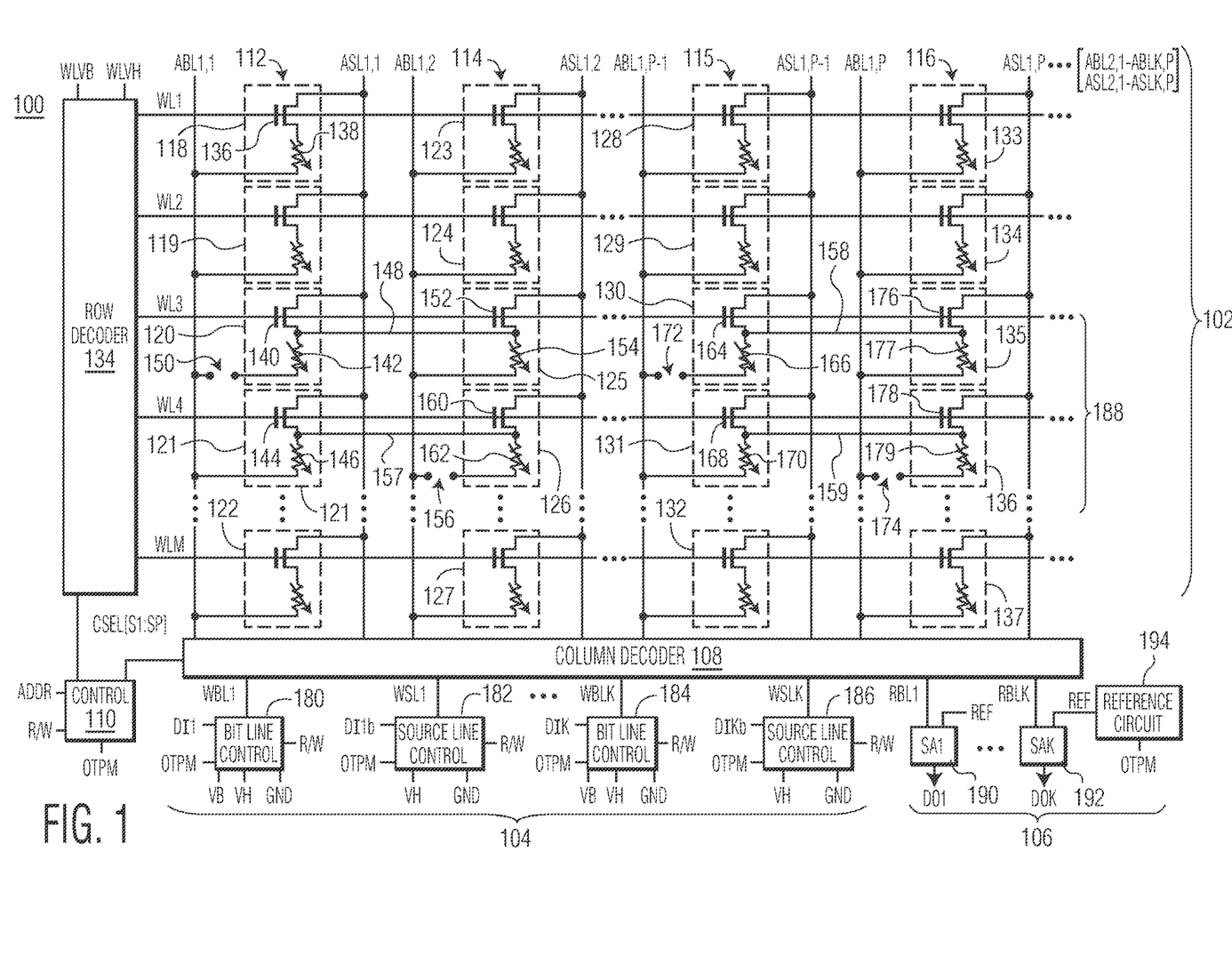
FIG. 1 is a diagram of an MRAM according to one embodiment of the present invention.

FIG. 1 is a diagram of an MRAM memory 100 according to one embodiment of the present invention. Memory 100 includes array 102 of MRAM cells located in M rows and N columns (including columns 112, 114, 115, and 116) for storing data, in which each of M and N can be any positive integer greater than one. Each of the M rows corresponds to a word line of array 102 (WL1-WLM). The N columns are sectioned into K groups of P columns each, such that N=K×P. Each of the N columns has a corresponding bit line, referred to as an array bit line (ABL), and a corresponding source line, referred to as an array source line (ASL). In FIG. 1, each ABL and ASL has a two number index. The first corresponds to the index of the K groups, and the second corresponds to the index of the P columns in the corresponding K group. For example, in FIG. 1, ABL1,1 through ABL1,P as well as ASL1,1 through ASL1,P correspond to the P columns within the first group of the K groups. Within the N columns there are therefore K groups, each including P columns.

Note that in FIG. 1, only a portion of the first group of columns is illustrated. However, as labeled at the top right of array 102, after ABL1,P and ASL1,P, the columns continue with ABL2,1 through ABL2,P and ALS2,1 through ASL2,P, etc., until the final group ABLK,1 through ABLK,P and ASLK,1 through ASLK,P. Therefore, the notation on FIG. 1 ([ABL2,1-ABLK,P and ASL2,1-ASLK,P]) refers to all these columns in groups two through K.

Referring to FIG. 1, the first group of the K groups includes columns 112, 114, 115, and 116. Column 112 includes cells 118-122, column 114 includes cells 123-127, column 115 includes cells 128-132, and column 116 includes cells 133-137. In one embodiment, each cell (118) is characterized as an MRAM cell that includes a magnetic tunnel junction (MTJ) (138 for cell 118) and a select transistor (136 for cell 118) whose control terminal is coupled to a word line (WL1-WLM) that is asserted to access a specific row of memory cells for either reads or writes to the cells. The word lines (WL1-WLM) are provided by an address row decoder 134 and are selectively activated (i.e. asserted) based on a portion of a memory address of an access request received by control 110 on address lines (ADDR) from processing circuitry (not shown). Each word line corresponds to a row of array 102, in which each row maybe be a regular MRAM row having N regular MRAM cells (such as the rows of WL1, WL2, and WLM, each having N regular cells for storing N bits of data) or may be an OTP row (such as rows 188, including the rows of WL3 and WL4, each having N/(number of connected columns) OTP cells to store N/(number of connected columns) bits of data). For example, each of WL3 and WL4 may be configured as an OTP row, in which pairs of columns are connected, resulting in N/2 OTP cells in each OTP row capable of storing N/2 bits of data.

Each regular MRAM cell (e.g. 118) of a column is connected to a corresponding array bit line of the column (e.g. ABL1,1) and a corresponding array source line of the column (ASL1,1). In the embodiment shown, a regular MRAM cell (118) is connected to the source line (ASL1,1) at the source of the select transistor (136). The regular MRAM cells of array 102 include, e.g., cells 118, 119, 122, 123, 124, 127, 128, 129, 132, 133, 134, and 137.

The rows of array 102 which form OTP rows are configured differently because multiple columns in an OTP row together form each OTP cell. In the illustrated embodiment, two columns are connected for each OTP cell in each OTP row (corresponding to WL3 and WL4), In the embodiment of FIG. 1, referring to the OTP rows of WL3 and WL4, pairs of adjacent columns in this row are connected, resulting in N/2 OTP cells (e.g. OTP cells 125, 135, 121, and 131). For example, in the OTP rows, columns 112 and 114 are connected and columns 115 and 116 are connected. MRAM cell 120 in column 112 is connected to MRAM cell 125 in adjacent column 114, and MRAM cell 130 in column 115 is connected to MRAM cell 135 in column 116. That is, the drain electrode of select transistor 140 in cell 120 is electrically connected (via conductor 148) to the drain electrode of select transistor 152 in cell 125, and the drain electrode of select transistor 164 is electrically connected (via conductor 158) to the drain electrode of select transistor 176 in cell 135. Similarly, in the row of WL4, MRAM cell 121 in column 112 is connected to MRAM cell 126 in column 114, and MRAM cell 131 in column 115 is connected to MRAM cell 136 in column 116. That is, the drain electrode of select transistor 144 in cell 121 is electrically connected (via conductor 157) to the drain electrode of select transistor 160 in cell 126, and the drain electrode of select transistor 168 is electrically connected (via conductor 159) to the drain electrode of select transistor 178 in cell 136.

As will be discussed further below, these electrical connections between the drains of the select transistors allow the select transistors of two cells in different columns within an OTP row to be connected in parallel with each other. For example, select transistors 140 and 152 are connected in parallel. The connected select transistors may be referred to herein as "drain-connected" select transistors. Note that these bit cell connections exist for pairs of MRAM cells along the entire length of each OTP row, through all K groups.

In addition to the electrical connections between pairs of select transistors in an OTP row, an MTJ of only one of the pair of connected bit cells is connected to the corresponding bit line of its column to operate as an OTP cell. The MTJ of the other bit cell is "removed" from array 102 by disconnecting a terminal of that MTJ from the corresponding bit line of its column. For example, referring to cell 125 in the OTP row of WL3, select transistor 152 and MTJ 154 of cell 125 are connected to ABL1,2 and ASL1,2 similar to a regular MRAM cell, in which a first terminal of MTJ 154 is connected to a drain of select transistor 152 and a second terminal of MTJ 154 is connected to ABL1,2. However, for cell 120 in this OTP row, select transistor 140 is connected to WL3, ASL1,1, and the first terminal of MTJ 142, but the second terminal of MTJ 142 is not connected to its corresponding bit line ABL1,1 (as illustrated by gap 150). In this manner, MTJ 142 of cell 120 is effectively removed from array 102. Therefore, between connected cells 120 and 125, only cell 125 (having MTJ 154) operates as an OTP cell while cell 120 may be referred to as a non-storing cell. The same is true for connected cells 130 and 135 in which MTJ 177 of cell 135 is connected to the drain of select transistor 176 and ABL1,P, but MTJ 166 of cell 130 is not connected to its corresponding bit line ABL1, P-1 (as illustrated by gap 172). Therefore, between connected cells 130 and 135, only cell 135 (having MTJ 177) operates as an OTP cell, while cell 130 is a non-storing cell.

Referring to the OTP row of WL4, select transistor 144 and MTJ 146 of cell 121 are connected to ABL1,1 and ASL1,1 similar to a regular MRAM cell, in which a first terminal of MTJ 146 is connected to a drain of select transistor 144 and a second terminal of MTJ 146 is connected to ABL1,1. However, for cell 126 in this OTP row, select transistor 160 is connected to WL4, ASL1,2, and the first terminal of MTJ 162, but the second terminal of MTJ 162 is not connected to its corresponding bit line ABL1,2 (as illustrated by gap 156). In this manner, MTJ 162 of cell 126 is effectively removed from array 102. Therefore, between connected cells 121 and 126, only cell 121 (having MTJ 146) operates as an OTP cell, while cell 126 is a non-storing cell. The same is true for connected cells 131 and 136 in which MTJ 170 of cell 131 is connected to the drain of select transistor 168 and ABL1,P-1, but MTJ 179 of cell 136 is not connected to its corresponding bit line ABL1, P (as illustrated by gap 174). Therefore, between connected cells 131 and 136, only cell 131 (having MTJ 170) operates as an OTP cell, while cell 136 is a non-storing cell.

In the illustrated embodiment, the non-storing cell (with the removed MTJ) in the OTP row of WL3 is the left cell of each connected pair, and in the OTP row of WL4 is the right cell of each connected cell. Alternatively, different patterns may be used for the OTP cell and non-storing cell of the two connected cells within an OTP row. Also, in the illustrated embodiment, the plurality of columns in each OTP row used for an OTP cell is two. However, in alternate embodiments, more than two columns can be used. For example, in the OTP row of WL3, cells in columns 112, 114, and a third column may be connected to form an OTP cell. In this scenario, there would be three bit cells in three different column of the OTP row having a total of three select gates connected in parallel with each other. Any pattern may be used to remove two of the three MTJs such that only one MTJ remains connected and useable as an OTP memory element for an OTP cell (while the other two cells are non-storing cells). For example, in one embodiment, a bit cell such as bit cell 130 may instead be a third bit cell in the group with bit cells 120 and 125 such that 3 cells in columns 112, 114, and 115 are connected to form an OTP cell. In this example, connection 158 would instead connect the drain of select transistor 164 to the drains of select transistors 140 and 152. Note that MTJ 166, like MTJ 142, is also removed from array 102. In this manner, in this group of 3 cells, only cell 125 is an OTP cell, while cells 120 and 130 would be non-storing cells corresponding to OTP cell 125. In yet other embodiments, any number of columns can be used in an OTP row to form an OTP cell.

OTP writes for OTP rows such as the OTP rows 188 will be discussed further below with respect to column decoder 108 of FIG. 5 and the timing diagram of FIG. 6. Note that the cells in OTP rows 188 configured to be OTP cells, such as cells 125, 135, 121, and 131, can be utilized as either regular MRAM cells to store a non-OTP bit value or OTP cells to store an OTP bit value, however, once they are blown, they are only useable as OTP cells.

Although FIG. 1 shows that array 102 includes M rows (corresponding to word lines WL1-WLM) and N columns (including 112, 114, 115, and 116), other embodiments may include a different number of rows (M) and/or a different number of columns (N). Also, any grouping of the N columns may be used. In one example, array 102 includes 512 columns (N=512) which are sectioned into 64 groups (K=64) of 8 bits (P=8). In some embodiments, the MTJs of the cells 118-137 of MRAM array 102 have the same structure. As used herein, MTJs having the same structure mean that the corresponding structures of the MTJs have the same physical dimensions and are made of the same materials within manufacturing tolerances. As used herein with respect to information stored in a memory, the term "data" also includes instructions or commands stored in a memory.

Memory 100 includes data read circuitry 106 for reading data stored in the cells of array 102. In the embodiment shown, read circuitry 106 includes sense amplifiers 190 and 192, each for sensing the data value stored in a memory cell by comparing the resistance of the memory cell to a reference resistance (through signal REF). During a read operation, a sense amplifier (190) is coupled to a bit line (e.g. ABL1,1) of a selected column (e.g. 112) by column decoder 108 to compare a resistance of a selected cell (e.g. 118) of that column to the reference resistance (through signal REF provided by a reference circuit 194). The sense amplifiers 190 and 192 output the read data (DO1-DOK) to processing circuitry (not shown) on a data bus (not shown).

Memory 100 includes data write circuitry 104 for writing data to memory cells of array 102. In the embodiment shown, data write circuitry 104 includes bit line control circuits 180 and 184 for controlling the voltage of the array bit lines of selected columns during a memory write operation to selected cells of the array. The data write circuitry also includes source line control circuits 182 and 186 for controlling the voltage of the array source lines of selected columns during a memory write operation to selected cells. Note that during writes, row decoder activates the selected word line by setting the selected word line to word line voltage that is greater than ground. For writing to a regular MRAM cell, the selected word line is set to a high word line voltage (WLVH), which may be greater than Vdd, and for performing an OTP write to an OTP cell, the selected word line may be set to a blow word line voltage (WLVB) which is greater than WLVH.

In the illustrated embodiment, column decoder 108 selectively couples the array bit lines of selected array columns to the bit line control circuits (180 and 184) as write bit lines WBL1-WBLK and selectively couples the corresponding array source lines of the selected array columns to the source line control circuits (182 and 186) as write source lines WSL1-WSLK during a memory write operation based on a portion of the received address ADDR for the write operation provided by control 110 to the column decoder. In the embodiment shown, column decoder 108 selectively couples the array bit lines of selected columns to sense amplifiers (190 and 192) and selectively couples the array source lines of selected columns to the source line control circuits (182 and 186) during a memory read operation based on the portion of the received address ADDR for the read operation provided by control 110 to column decoder 108. (Note that parts of column decoder 108, such as those used to properly connect selected bit lines or source lines with the corresponding WBL or WSL, may also be considered as part of the write circuitry.

In one embodiment, the decode ratio (N/K) of decoder 108 is 8 to 1. In one example, N is assumed to be 512 such that there are 512 array columns and K is 64, such that there are 64 sense amplifiers/line control circuit pairs. However, this ratio may be of other values in other embodiments (e.g. 1, 4, 16). In some embodiments, the bit line control circuit (180) may be integrated with a sense amplifier (190). The column decoder 108, in addition to the portion of ADDR for determining which columns are selected, also receives the read/write (R/W) signal which indicates a read or write operation.

Figure 5:
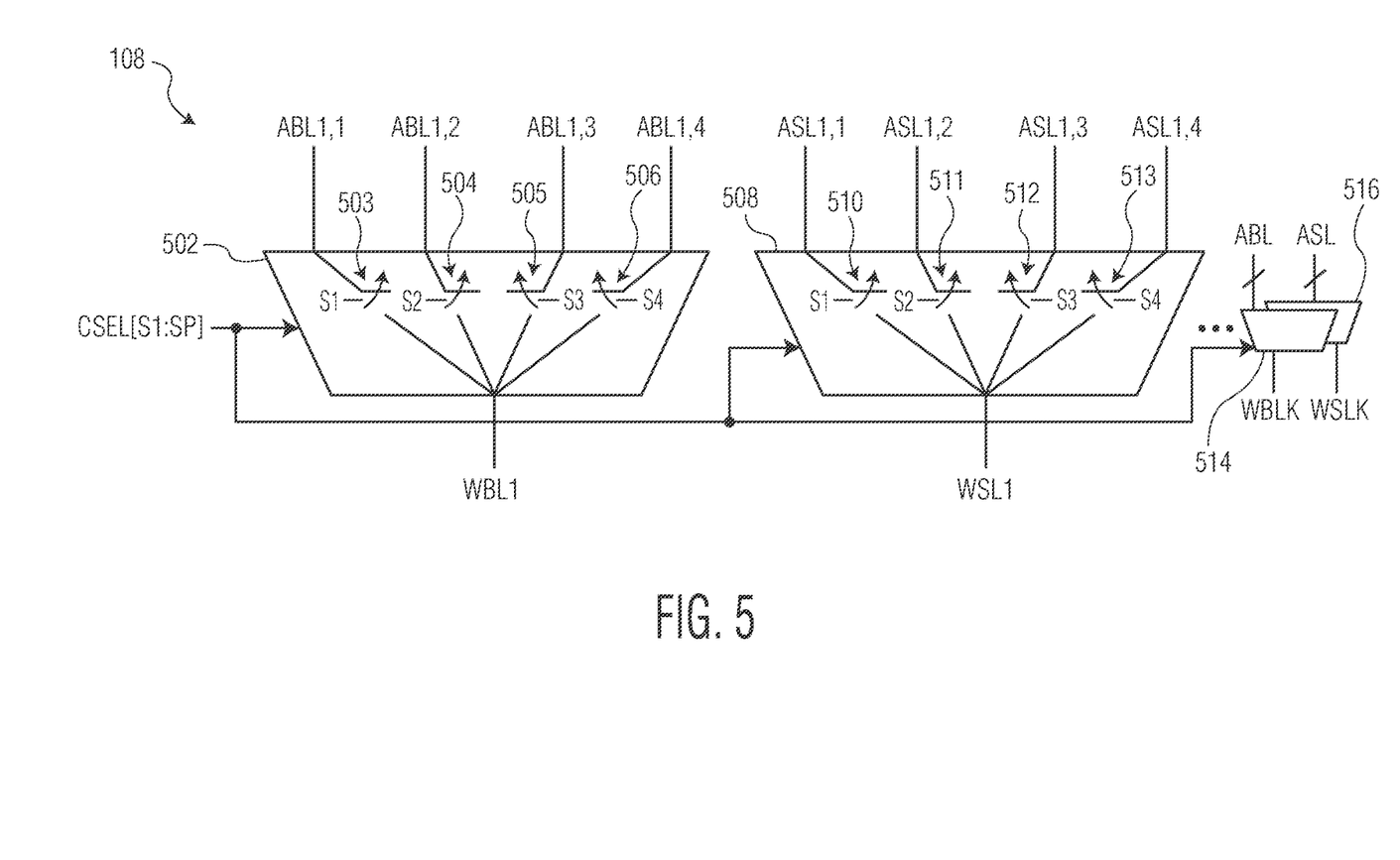
FIG. 5 illustrates, in block diagram form, a portion of column decoder 108 of FIG. 1 according to one embodiment of the present invention.

FIG. 5 illustrates, in partial block diagram and partial schematic form, one example of column decoder 108. With N=512 and K=64, P would equal 8 (because P=N/K). However, in the illustrated example of FIG. 5, for ease of illustration, it is assumed that P=4 such that each of the K groups only includes 4 columns (4 ABLs and 4 ASLs). In alternate embodiments, P can be any number such as 8 or 16, depending on the parameters and design of memory 100.

Referring to FIG. 5, column decoder 108 includes multiplexers (e.g. 502, 508, 514, and 516) which are coupled to a group of ABLs and the corresponding group of ASLs (each group having P lines). For example, multiplexer (MUX) 502 corresponds to the first group of the K groups and is coupled to P array bit lines, ABL1,1, ABL1,2, ABL1,3, and ABL 1,4. MUX 508 also corresponds to the first group and is coupled to the corresponding P array source lines ASL1,1, ASL1,2, ASL1,3, and ASL 1,4. Based on the value at the control input of the MUXes, provided by CSEL[S1:SP] based on the portion of ADDR, each MUX selects one or more of the array bit lines to couple to the corresponding write bit line (WBL) or one or more of the source bit lines to couple to the corresponding write source line (WSL). For example, MUX 502 includes four switches, 503-506, each coupled between a corresponding ABL and the output of MUX 502 so as to connect one or more of ABL1,1, ABL1,2, ABL1,3, and ABL1,4 to the output of MUX 502 to provide WBL1. MUX 508 includes four switches, 510-513, each coupled between a corresponding ASL and the output of MUX 508 so as to connect one or more of ASL1,1, ASL1,2, ASL1,3, and ASL1,4 to the output of MUX 508 to provide WSL1. Column decoder 108 includes one MUX configured like MUX 502 for each of the K groups of ABLs to provide a corresponding one of WBL1-WBLK, and one MUX configured like MUX 508 for each of the K groups of ASLs to provide a corresponding one of WSL1-WSLK. For example, MUX 514 connects one or more of ABLK,1, ABLK,2, ABLK,3, and ABLK,4 to the output of MUX 514 to provide WBLK, and MUX 516 connects one or more of ASLK,1, ASLK,2, ASLK,3, and ASLK,4 to the output of MUX 516 to provide WSLK.

Within MUX 502, switch 503 is coupled between ABL1,1 and WBL1, switch 504 is coupled between ABL1,2 and WBL1, switch 505 is coupled between ABL1,3 and WBL1, and switch 506 is coupled between ABL1,4 and WBL1. Bit S1 of CSEL is provided to the control input of switch 503, bit S2 of CSEL is provided to the control input of switch 504, bit S3 of CSEL is provided to the control input of switch 505, and bit S4 of CSEL is provided to the control input of switch 506. When the bit at the control input of the switch is asserted, the switch is closed (connecting the corresponding ABL to WBL1), and when the bit at the control input of the switch is not asserted (e.g. negated or cleared), the switch is open (disconnecting the corresponding ABL from WBL1). The bits S1-S4 (referred to as switch control bits) are provided in the same manner to the control inputs of the switches in each of the MUXes. Note that the number of bits in CSEL corresponds to P, and each MUX includes P switches, corresponding to each of the received P ABLs or P ASLs. The values of CSEL are determined by control 110 based on a portion of the incoming address, ADDR. For example, in one embodiment, a portion of ADDR is decoded to produce one control bit for each switch in the MUXes of column decoder 108. In alternate embodiments, a more complex switch circuit may be used to implement each switch, and depending on the implementation of the switching circuitry in the MUXes, more than one control bit may be provided for each switch circuit between an ABL and WBL or ASL and WSL.

During a write to a non-OTP row, only one ABL of each group is connected to the output of the corresponding MUX to provide the WBL and only one ASL of each group is connected to the output of the corresponding MUX to provide the WSL. In this manner, for a bit cell in any non-OTP row, depending on the data input value being written (provided as DI1-DIK), a write current flows in one direction or the other through the MTJ of the selected bit cell. This write current is driven by a single select transistor of the selected bit cell. Also, for a write to a non-OTP row, CSEL[S1:SP] includes only one hot value. That is, only one ABL and one ASL is selected for each MUX to connect to WBL and WSL, respectively. In the illustrated embodiment, this indicates that only one bit of bits S1-SP is asserted to select the only one switch in each MUX to close.

During a write to an OTP row, though, multiple ABLs of each group are connected to the output of the corresponding MUX to provide the WBL and multiple ASLs of each group are connected to the output of the corresponding MUX to provide the WSL. The select transistors corresponding to the multiple ABLs/ASLs in the OTP row are drain-connected, as described above with the connected pairs in OTP rows 188 (e.g. select transistor 152 of cell 125 and select transistor 140 of cell 120). Therefore, any write current provided through the MTJ of the selected OTP bit cell in the OTP row is driven by multiple select transistors operating in parallel (including the select transistor of the selected OTP bit cell as well as other select transistors in the non-storing cells of the OTP row which are drain-connected to this select transistor, and thus corresponding to the other ABLs/ASLs of the multiple ABLs/ASLs). Therefore, for a write to an OTP row, CSEL[S1:SP] includes multiple hot values. That is, multiple ABLs and ASLs are selected for each MUX to connect to WBL and WSL, respectively. In the illustrated embodiment, this indicates that multiple bits of S1-SP are asserted to select the multiple switches in each MUX to close. In this example, if the cells in each OTP row are connected by pairs in adjacent columns, as in FIG. 1, then CSEL[S1:SP] for a write to an OTP row would include two asserted bits.

In one embodiment, memory 100 is located on the same integrated circuit as the processing circuitry (not shown) that requests the memory accesses. In other embodiments, memory 100 may be located on a separate integrated circuit. In still other embodiments, memory 100 may have other configurations. Note that in the illustrated embodiment, a plurality of rows, such as the rows of WL3 and WL4, which form an OTP row (such as OTP rows 188) are immediately adjacent rows. However, in alternate embodiment, they need not be immediately adjacent. Also, although as illustrated in OTP rows 188, the pairs of connected bit cells within an OTP row are in adjacent columns, such as bit cells 120 and 125 in adjacent columns 112 and 114, memory 100 can be configured such that the columns of the connected bit cells within the OTP row are not adjacent each other. Furthermore, any number of bit cells in an OTP row can be connected to allow for any number of select transistors to drive current for an OTP write to the OTP cell of the connected bit cells. Also, in one embodiment, every row in MRAM 100 may be configured as an OTP row.

Figure 2:
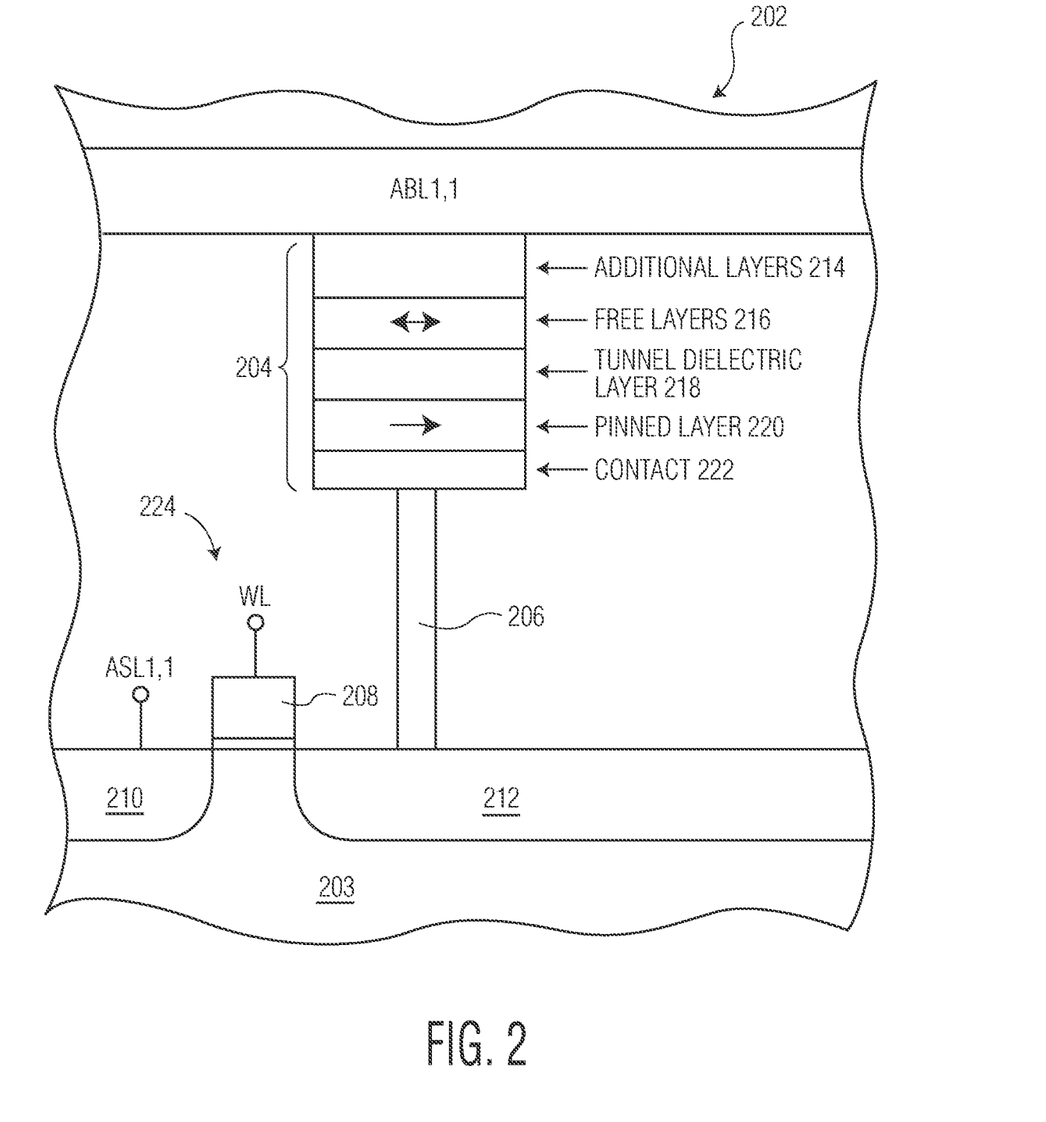
FIG. 2 is a side view of a MRAM cell of FIG. 1 according to one embodiment of the present invention.

FIG. 2 is a side view of an MRAM cell 202, which can represent any of the regular MRAM cells or OTP memory cells in column 112 of array 102 of FIG. 1, according to one embodiment of the present invention. In the embodiment shown, an access transistor 224 of cell 202 is a complementary metal-oxide-semiconductor (CMOS) transistor with a source region 210 and drain region 212 located in a semiconductor substrate 203 of an integrated circuit. Source region 210 is connected to array source line ASL0. Drain region 212 is connected to magnetic tunnel junction (MTJ) 204 by via 206 which is located in one or more interconnect layers of the integrated circuit of the MRAM. The gate 208 of transistor 224 is connected to a word line WL.

In the case of a regular MRAM cell, cell 202 can be, for example, cell 118, 119, or 122, with select transistor 224 being the select transistor of the cell. The word line connected to the gate of select transistor 224 can be any non-OTP row word line, such as WL1, WL2, WLM. In the case of an OTP cell, the word line can be one of the word lines which are connected to form an OTP row, such as WL3 for cell 120. Also, in the case of an OTP cell, the select transistor of another bit cell in another column, would also be present and its drain would also be connected to MTJ 204. For example, in the case that memory cell 202 is cell 125 in column 114 of the OTP row of WL3, select transistor 224 is select transistor 152 and MTJ 204 is MTJ 154, in which select transistor 224 is connected to WL3, and select transistor 140 (in column 112 of the OTP row of WL3) would also be connected to MTJ 204.

In the embodiment shown, MTJ 204 includes a conductive contact layer 222, a pinned magnetic layer 220, a tunnel dielectric layer 218, and a free magnetic layer 216. In the embodiment shown, MTJ 204 also includes additional layers 214 that include conductive layers. In one embodiment, pinned magnetic layer 220 and free magnetic layer 216 are made of ferromagnetic materials such as cobalt iron boron (CoFeB) and tunnel dielectric layer is made of a dielectric material such as magnesium oxide (MgO). However, these layers may be made of other materials in other embodiments. Also, in other embodiments, an MRAM cell may have other configurations.

The magnetization direction of the pinned layer 220 is fixed. The magnetization direction of free layer 216 can be programmed to be in a parallel direction or an anti-parallel direction to the magnetization direction of pinned layer 220 in order to store a 1 or 0 value in the memory cell. When the magnetization direction of free layer 216 is in an anti-parallel direction, the resistance of the MTJ is at a relatively high value. When the magnetization direction of free layer 216 is in a parallel direction, the resistance of the MTJ is of a relatively lower value. When a sense amplifier is coupled to both the array bit line of the cell and to a reference resistance that is in between the high resistive value and the low resistive value during a read in an MRAM mode, a determination can be made as to whether a 1 value (e.g. high resistance (HR) state) or a 0 value (e.g. low resistance (LR) state) is stored in the MTJ.

During a write operation to a regular MRAM cell in an MRAM mode, the magnetization direction of free layer 216 can be set by applying a voltage differential of sufficient magnitude across the MTJ to generate the desired current density for setting the magnetization direction of free layer 216. In one embodiment, the magnetization direction of free layer 216 can be set by in one direction by applying a higher voltage (VH) to the array bit line (ABL1,1) and a lower voltage (Gnd) to the source line (ASL1,1) while select transistor (e.g. 224) is conductive (with WLVH at its gate), and can similarly be set in the other direction by applying the lower voltage (Gnd) to the array bit line and the higher voltage (VH) to the array source line while the select transistor is conductive.

In one embodiment, layers 222, 220, 218, 216, and 214 have a circular disk configuration where the width shown in FIG. 2 is the diameter of the circle. The greater the surface area of the circle, the higher the voltage differential needed to switch the resistive state of the cell. In the case where these layers have a circular disk configuration, the magnetization direction is perpendicular to the arrows illustrated in FIG. 2. In one embodiment, the voltage differential between VH and ground is in the range of 1-2 Volts but may be of other values in other embodiments.

During a write operation to an OTP cell (e.g. cell 125) of an OTP row in an OTP mode, a sufficiently higher voltage differential can be applied between the array bit line and array source line when the plurality of parallel-connected select transistors (e.g. select transistors 140 and 152 for cells 120 and 125) corresponding to the pair of connected cells of the OTP row (e.g. cell 120 and cell 125) are conductive (with WLVB at their gates) to permanently break down the tunnel dielectric layer 218. In this manner, MTJ 204 results in having a relatively low resistance value as compared to the resistance value of an unblown cell (either the high resistance state or the low resistance state) where the tunnel dielectric layer is not broken down. As used herein, a cell whose tunnel dielectric has been permanently broken down is referred to as a "blown" cell. Once a cell has been blown, it cannot be reprogrammed to provide high and low resistive values possible with an unblown cell regardless of the magnetization direction of free layer 216.

Note that, since there are multiple parallel select transistors used to blow any selected OTP cell in the OTP mode, a higher current can be driven through the MTJ of the selected OTP cell, preventing the need to overdrive a single select transistor (as would be the case in any row not configured as an OTP row). Also, with the reduced impedance provided by the parallel select transistors, the voltage applied during an OTP write to blow the MTJ can be more focused over the MTJ, allowing for an increased current to permanently break down the tunnel dielectric. Therefore, while each OTP row has a reduced number of bit cells capable of storing values (e.g. N/2 rather than N in the example of FIG. 1) in order to provide a plurality of parallel-connected select transistors to blow the MTJ of the selected cell, the blowing of the selected cell can be performed more efficiently, without overdriving any of the select transistors.

Also, note that a write operation to an OTP cell of an OTP row can also be performed in the MRAM mode rather than the OTP mode. In this situation, multiple parallel-connected select transistors are also conductive, but the corresponding MTJ which is coupled to the bit line of the column (e.g. MTJ 154 for cell 125) is set to the high or low resistive state but is not blown. For this write, the word line voltage can be set to WLVH. That is, any MTJ in an OTP bit cell can still be accessed in the MRAM mode, so long as it has not already been blown.

Referring back to FIG. 1, data write circuitry 104 of memory 100 includes circuitry for performing an MRAM mode write and an OTP mode write. Control circuit 110 provides an OTPM signal to each of the K bit line control circuits (e.g. 180 and 184) and to each of the K source line control circuits (e.g. 182 and 186) to control whether these circuits are in an MRAM mode or an OTP mode for writing data to a memory cell. During a write operation, the bit line control circuits each receive a data input value (DI1-DIK, respectively) and the corresponding source line control circuits each receives a complementary data input value (DI1B-DIKB, respectively). In the embodiment shown, the bit line and source line control circuits also receive the read/write signal (R/W) from control 110 which would indicate a write during a write mode.

If in an MRAM write mode (the OTPM signal is not asserted), bit line control circuits provide either the high voltage (VH) or low voltage (Gnd) to the selected bit lines (via column decoder 108) depending on the values of DI1 and DIK, respectively, to be written to the cells. During an MRAM mode write, the source line control circuits provide the opposite voltage values (VH or Gnd) as provided by the corresponding bit line control circuits, respectively, so that the voltage differential across each cell has the appropriate polarity to write the desired value to the cell. Also, row decoder 134 applies WLVH to the selected word line.

For example, if bit cell 118 is one of the selected bit cells for a normal write operation (in the MRAM write mode), ABL1,1 is connected to WBL1 by MUX 502 in column decoder 108 and ASL1,1 is connected to WSL1 by MUX 508 in column decoder 108. The voltage on WL1 is set to the programming word line voltage WLVH. Depending on the value of DI1, bit line control 180 connects WBL1 to VH or GND, and depending on the value of DI1b, source line control 182 connects WSL1 to the other of VH or GND. In one embodiment, a value of "1" for a data input corresponds to providing current in a first direction through the MTJ to program the selected bit cell to the HR state and a value of "0" corresponds to providing current in an opposite direction through the MTJ to program the selected bit to the LR state. Alternatively, a value of "1" for a data input corresponds to writing the selected bit cell to the LR state and a value of "0" to the HR state. In this example, the current is provided by only one select transistor, select transistor 136, through MTJ 138 of bit cell 118. Normal (non-OTP) writes to any bit cell in a non-OTP row are performed in this manner.

During an OTP mode write (when the OTPM signal is asserted), the bit line control circuits provide the higher voltage (VB) for blowing a cell or a lower voltage (e.g. VH or Gnd) for not blowing a cell depending upon whether an OTP 0 or 1 is to be written to the cell. If an OTP 0 is be written, then the bit line control circuit provides the voltage VB to the bit line to blow the cell. If an OTP 1 is to be written, then the bit line control circuit provides a lower voltage (e.g. VH or Gnd) to the bit line such that the cell is not blown. During an OTP mode write according to one embodiment, the source line control circuit provides the lower voltage (Gnd) to the source line regardless of whether an OTP 1 or 0 is to be written to the cell. Also, during an OTP mode write, row decoder 134 may apply WLVB rather than WLVH to the selected word line.

For example, if OTP bit cell 125 is one of the selected bit cells for a write operation, both ABL1,1 and ABL1,2 are connected to WBL1 by MUX 502 in column decoder 108 and both ASL1,1 and ASL1,2 are connected to WSL1 by MUX 508 in column decoder 108. Therefore, select transistor 152 of the selected bit cell 125 is coupled in parallel with select transistor 140 of bit cell 120 which is paired and connected with bit cell 125. To write an OTP 0 to OTP bit cell 125, the voltage on WL3 may be set to WLVB. Bit line control 180 provides VB to WBL1, and source line control 182 provides GND to WSL1. This results in blowing MTJ 154 (resulting in a very low resistance, lower than LR and HR states). To write an OTP 1 to OTP bit cell 125, WL3 may be set to WLVH instead of WLVB. Bit line control 180 provides VH or GND to WBL1, and source line control 182 provides GND to WSL1. This results in not blowing MTJ 154 (meaning it could be in either the LR or HR state). OTP writes to any bit cell in an OTP row may be performed in this manner.

In the embodiment shown, the bit line control circuits (e.g. 180 and 184) and source line control circuits (e.g. 182 and 186) are shown as receiving voltages VB, VH, and ground (Gnd) (e.g. from voltage regulators (not shown)) and selectively supplying one of those voltages to the bit line and the source line. In other embodiments, the bit line control circuits and source line control circuits may include voltage regulators and/or charge pumps whose output voltages are adjustable for providing the different voltages. Also, the lower voltage level may be another voltage level (e.g. a negative voltage level such as 200 mV) other than ground.

In other embodiments, the bit line control circuits may provide the same high voltage level for both an MRAM mode write and an OTP mode write. In such an embodiment, the source line control circuits provide a lower voltage during an OTP mode write than during an MRAM mode write for providing a greater voltage differential across an MTJ cell during an OTP mode write for blowing the MTJ of the MRAM cell.

Memory 100 also includes read circuitry 106 that can read the MRAM cells of array 102 in both an MRAM mode and an OTP mode. In the embodiment shown, memory 100 includes K sense amplifiers (e.g. 190 and 192) that each receive a reference resistance (through signal REF) from reference circuit 194. Reference resistance is selectable between two different resistance values, one for MRAM mode reads and one for OTP mode reads.

Figure 3:
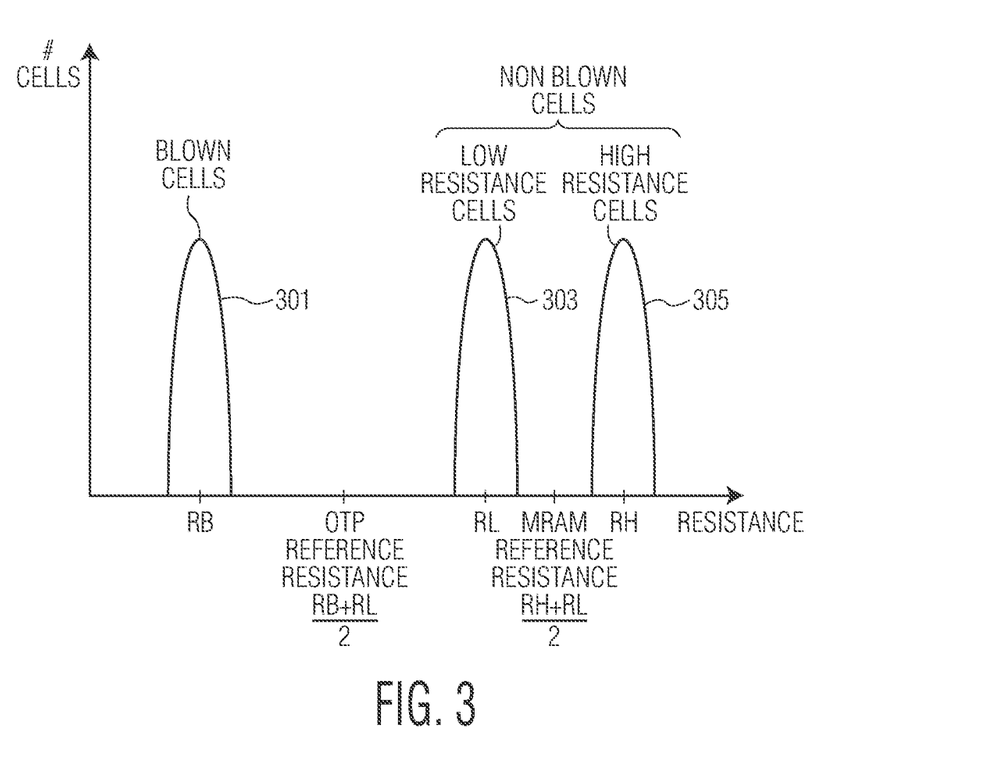
FIG. 3 is a graph showing a distribution of resistances of cells of an MRAM array according to one embodiment of the present invention.

FIG. 3 is a graph showing a distribution of resistances of cells of a MRAM array according to one embodiment of the present invention. In FIG. 3, the resistance values are on the X axis and the number of cells having a particular resistance are on the Y axis. FIG. 3 shows the resistance distribution for cells of an MRAM array that are blown and those that are not blown. The cells that are not blown are either in a low resistance state or a high resistance state depending upon in one embodiment, whether the magnetization direction of the free layer of its MTJ is in a parallel or anti-parallel direction with the magnetization of the fixed layer.

In the embodiment shown, the blown cells have a resistance distribution 301 centered on the resistive value RB. The low resistance state cells have a resistance distribution 303 centered on RL, and the high resistance state cells have a resistance distribution 305 centered on resistance RH. The OTP mode reference resistance is centered half way between RB and RL. The MRAM mode reference resistance is centered half way between RL and RH.

During an MRAM read mode, providing a sense amplifier with the MRAM reference resistance allows for the sense amplifier to distinguish between a low resistance cell and a high resistance cell to determine whether the cell is storing a 0 or a 1. During an OTP mode read, providing a sense amplifier with the OTP reference resistance allows for the sense amplifier to distinguish between a blown cell and a non-blown cell, regardless of whether the non-blown cell has a low resistance state or a high resistance state.

Figure 4:
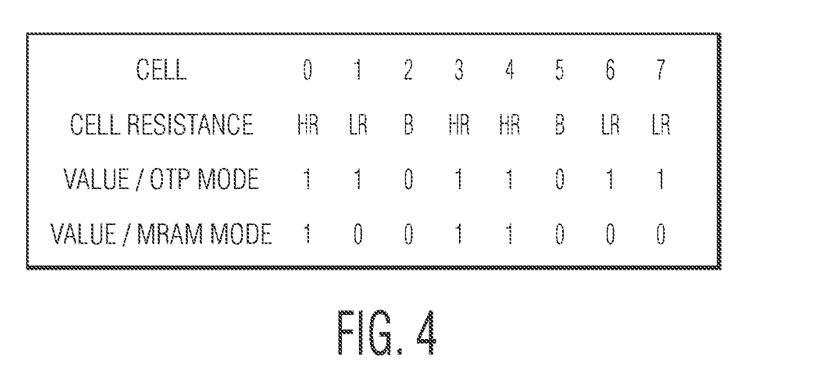
FIG. 4 is chart illustrating the relationship between resistance states and data values for an MRAM read mode and an OTP read mode according to one embodiment of the present invention.

FIG. 4 is a chart illustrating the relationship between resistive states and data values for an MRAM read mode and an OTP read mode according to one embodiment. The top line identifies the cell numbers for 8 MRAM cells that have been subjected to an OTP mode write of 11011011. In one embodiment, during an OTP mode write, cells that are written with a "0" value are blown (represented as a "B" in the second line). Cells that are written to with a "1" are not blown and can be at either a high resistance state (HR) or a low resistance state (LR).

If the cells are read during an OTP mode with the OTP mode reference resistance provided to the eight sense amplifiers providing the output data values, then the values of 11011011 will be read in that a 1 value will be read for either a high resistance state or a low resistance state. See line three of FIG. 4. However, if the cells were to be read in an MRAM mode where the MRAM mode reference resistance is provided to the sense amplifiers, then the sense amplifiers would return a value of 10011000, where both low resistance cells and blown cells would provide a 0 value. See line four of FIG. 4.

In one embodiment, because during an OTP mode write, only the cells that are written with a 0 are blown, memory 100 uses a lower OTP mode reference resistance to read the cells in order to determine whether a cell was blown or not blown, regardless of whether the non-blown cell has a high resistance value or a low resistance value. In some embodiments, this may allow a group of cells to be used as OTP cells even if the non-blown cells are subsequently written with a high resistance value or a low resistance value.

With some embodiments, one advantage of using a lower OTP reference resistance is that the stored value of the OTP non-blown cells may not be changed when subjected to an external magnetic field. With some MRAM cells, exposing an MRAM to an external magnetic field may cause the MRAM cells to switch magnetic states (e.g. from a high resistance state to a low resistance state or vice versa). However, because the read circuitry of the MRAM distinguishes between a blown cell and a non-blown cell regardless of the resistive state of the non-blown cell, OTP stored data may not be corrupted by an external magnetic field. Such a feature may be advantageous in thwarting a malicious attack on the MRAM with an external magnetic field. In some embodiments, bootup code may be programmed in the MRAM by an OTP mode write. If a magnetic field attack is detected in a system utilizing the MRAM, the system can reboot from the code in the OTP mode written cells as opposed to rebooting from possibility corrupted code in the MRAM mode written cells.

Furthermore, because the MTJs of the cells of array 102 all have the same structure, it may be more difficult in some embodiments, for a third party to reverse engineer the OTP mode written code in the MRAM. With some other prior art MRAMs using MRAM cells as OTP devices, the OTP MRAM cells have a different structure (e.g. different size) which makes determining the location of such cells devices relatively easier. Whereas with some embodiments of the present invention, the location of the OTP cells cannot be determined by the physical shape of the MTJ, thereby making the content in those cells more obscure.

Both FIGS. 3 and 4 assume that MRAM array 102 includes both regular MRAM rows and OTP rows. That is, MRAM array 102 may include both regular MRAM cells and OTP cells. In this case, both an OTP reference resistance and an MRAM reference resistance need to be available for reference circuit 194 to provide to the sense amplifiers based on whether or not an OTP mode read is being performed. The OTP reference resistance is needed to differentiate the difference between a blown (0) OTP cell and a non-blown (1) OTP cell. The MRAM reference is needed to further differentiate the difference between a high and a low resistive state for a regular MRAM cell. However, if MRAM array 102 is configured to only include OTP rows, then only one reference, the OTP reference resistance, need be provided by reference circuit 194. In this example, every row of the MRAM would be structured similar to OTP rows 188 in which two or more select transistors of bit cells in different columns within the OTP row are drain-connected. In this example, it would also not be necessary to provide the OTPM signal as there would be no need for memory 100 to differentiate between OTP reads and writes and regular MRAM reads and writes.

Figure 6:
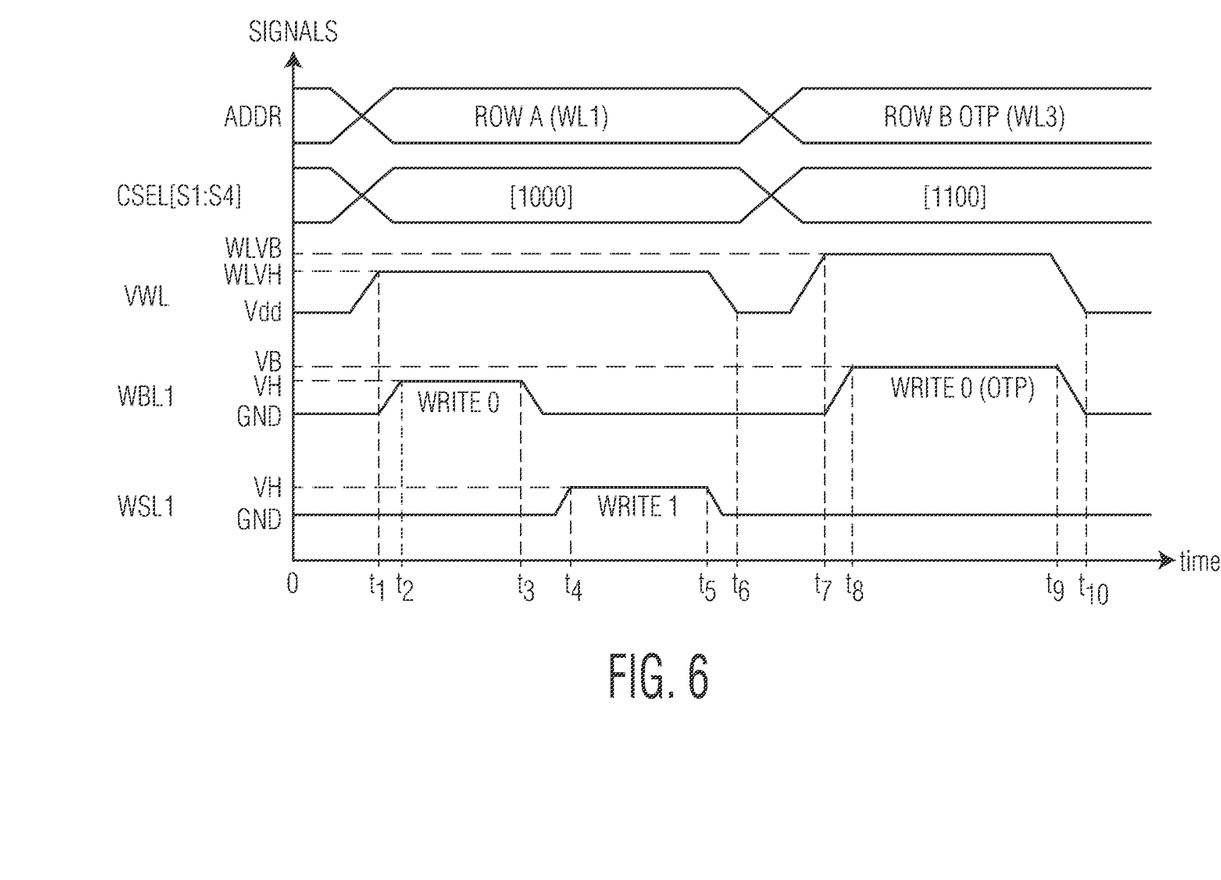
FIG. 6 is a timing diagram for writing to an MRAM according to one embodiment of the present invention.

FIG. 6 is a timing diagram for writes to a non-OTP row and to an OTP row of MRAM array 102, in accordance with one embodiment of the present invention. At time $t_1$, writes to RowA occur, in which RowA can be any non-OTP row of MRAM array 102. In the illustrated example, WL1 is used as the non-OTP row. Therefore, at time $t_1$, the voltage of the selected word line, VWL, is set to WLVH to activate the word line, in which WLVH corresponds to the voltage of an activated word line for a non-OTP write. In the illustrated embodiment, WL1 is the selected word line that is activated by setting it to WLVH. (Note that prior to the selection and activation of WL1, WL1 is set to a voltage lower than WLVH, which is Vdd in this example.) Also based on the received ADDR, CSEL[S1:S4] is provided as [1000] indicating that the first bit cell in each of the k groups is selected by the column decoder. With S1 asserted, the first bit line of each group (e.g. ABL1,1) is connected to the corresponding WBL (e.g. to WBL1 via closed switch 503) and the first source line of each group (e.g. ASL1,1) is connected to the corresponding WSL (e.g. to WSL1 via closed switch 510).

With WL1 at WLVH, a write 0 is performed to a first bit cell (bit cell 136 in the illustrated embodiment) coupled to WL1, ABL1,1, and ASL1,1. At time $t_2$, the voltage on the bit line (on WBL1 which is connected by MUX 502 in column decoder 108 to ABL1,1) for cell 136 is set to VH while the voltage on the corresponding source line (on WSL1 which is connected by MUX 508 in column decoder 108 to ASL1,1) is set to GND, such that current flows in a first direction through MTJ 138 to store a non-OTP bit value of 0 to bit cell 136. At time $t_3$ the write 0 ends and at time $t_4$, a write 1 is performed on bit cell 136. For a write 1, the voltage on the source line (WSL1) is set to VH while the voltage on the bit line (WBL1) is set to GND, such that current flows in a second and opposite direction through MTJ 138 to store a non-OTP bit value of 1 to bit cell 136. The write 1 ends at time $t_5$, and at time $t_6$, the selected word line (WL1) is deactivated by placing it again at the low voltage, Vdd, in the current example. Note that the write 0 and write 1 are illustrated as back to back in time, for ease of illustration. However, $t_3$ and $t_4$ may be separated by any amount of time. That is, for writes to RowA, any value, 1 or 0, can be written each bit cell of RowA at any time, as directed by a write operation.

At time $t_7$, writes to RowB occur, in which RowB can be any OTP row of MRAM array 102. In the illustrated example, WL3 is used as the OTP row. Based on the received ADDR, CSEL[S1:S4] is provided as [1100] indicating that the selected OTP cell selected by the column decoder corresponds to one of the first two bit cells in each of the k groups (the bit cell whose corresponding MTJ is connected to an array bit line). In the example of the OTP row of WL3, bit cell 125 of the bit cell pair of 120/125 is the selected OTP cell and bit cell 120 is the non-storing cell corresponding to the selected OTP cell. With both S1 and S2 asserted, the first and second bit line of each group (e.g. ABL1,1 and ABL1,2) are connected to the corresponding WBL (e.g. to WBL1 via closed switches 503 and 504, respectively) and the first and second source line of each group (e.g. ASL1,1 and ASL1,2) are connected to the corresponding WSL (e.g. to WSL1 via closed switches 510 and 511, respectively). In this manner, select transistors 140 and 152 are connected in parallel.

At time $t_7$, the voltage of the selected word line, VWL, is set to WLVB to activate the word line, in which WLVB corresponds to the voltage of an activated word line for an OTP write and is higher than WLVH to help ensure that the MTJ of the selected bit cell is blown. In the illustrated embodiment, WL3 is the selected word line that is activated by setting it to WLVB.

With WL3 at WLVB, an OTP write of 0 is performed to the selected OTP bit cell (bit cell 125 in the illustrated embodiment). As described above, an OTP write of 0 corresponds to blowing the MTJ of the selected bit cell, in which upon a read in OTP mode, any blown MTJs are read as 0 and any unblown MTJs, whether programmed to a 1 or a 0, are read as 1. At time $t_8$, the voltage on the bit line (on WBL1) for cell 125 is set to VH while the voltage on the corresponding source line (on WSL1) is set to GND, such that current flows in a first direction through MTJ 154 to blow MTJ 154 and thus store a 0 to bit cell 125. Note that in the example of bit cell 125, MTJ 154 of bit cell 125 is blown and both select transistors 140 of bit cell 120 and 152 of bit cell 125 drive current, in parallel, through MTJ 154 (in which MTJ 142 of bit cell 120 is disconnected from ABL1, 1). In this example, bit cell 125 stores the 0 in column 114 of the OTP row.

In an alternate embodiment, if instead MTJ 154 were disconnected from ABL1,2 instead of MTJ 142 being disconnected from ABL1,1, then both select transistors 140 and 152 would drive current through MTJ 142 to blow MTJ 142. In this case, bit cell 120 coupled to WL3 and ABL1,1 would be the OTP cell and store the 0 in column 112 of the OTP row while bit cell 125 would be the corresponding non-storing cell. Therefore, note that for an OTP write, two connected bit cells (e.g. 120 and 125) with drain-connected select transistors are required to store an OTP value in one OTP cell. For an OTP bit value of 0, one of the MTJs of the two connected bit cells (in the OTP cell) is blown and the other MTJ of the two connected bit cells (in the non-storing cell) is "removed", and for an OTP bit value of 1, neither of the MTJs of the two connected bit cells are blown. At time $t_9$ the OTP write 0 ends, and at time $t_{10}$ the selected word line (WL3) is deactivated by placing it again at the low voltage, Vdd, in the current example.

Note that a non-OTP write can also be performed to OTP rows to write non-OTP bit values of 1's or 0's to the OTP row, in which any bit cell in an OTP row written to a 1 or 0 is considered as not being blown. However, for non-OTP writes to an OTP row, two or more connected bit cells (having drain-connected select transistors) are still required to store one bit value.

Therefore, by now it can be understood how rows of an MRAM array can be configured as an OTP row, in which multiple columns in the OTP row can be connected such that multiple select gates of the multiple columns in the OTP row operate in parallel to drive current through one MTJ. This may allow for improved efficiency when blowing the MTJ. For example, upon an OTP write to blow the MTJ of an OTP cell in the OTP row, the column decoder connects multiple bit lines of the MRAM array corresponding to the multiple columns in the OTP row. In this manner, multiple select gates of multiple bit cells in the OTP row are selected for driving current through one MTJ of the multiple bit cells. In some embodiments, it is possible to have both OTP and non-OTP rows in an MRAM array, in which a control signal may be used to indicate to the read and write circuitry when an OTP read or write is occurring as opposed to a non-OTP read or write.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The following are some embodiments of the present invention.

A magnetoresistive random access memory (MRAM) includes an MRAM array including MRAM cells arranged in rows and columns, each row having a corresponding word line and each column having a corresponding bit line and a corresponding source line, wherein an intersection of each row and column has a corresponding MRAM cell, and wherein each corresponding MRAM cell includes a select transistor and a Magnetic Tunnel Junction (MTJ). A first row along a first word line of the MRAM array is configured as a single one-time-programmable (OTP) row, and a first MRAM cell in a first column of the OTP row is connected to a second MRAM cell in a second column of the OTP row, different from the first column, wherein a source electrode of a select transistor in the first MRAM cell is connected to a first source line corresponding to the first column, and a source electrode of a select transistor in the second MRAM cell is connected to a second source line corresponding to the second column, drain electrodes of the select transistors in the first and second MRAM cells are electrically connected to each other, and a first MTJ of the first MRAM cell is connected to a first bit line corresponding to the first column, and a second MTJ of the second MRAM cell is not connected to a second bit line corresponding to the second column. The MRAM includes write circuitry coupled to the bit lines of the MRAM array, wherein during a write to the first MRAM cell, the write circuitry is configured to connect the first bit line and the second bit line to a first voltage supply terminal and the first source line and the second source line to a second voltage supply terminal such that the select transistors in the first and second MRAM cells are connected in parallel with each other to drive a write current through the first MTJ; and a row decoder coupled to word lines of the MRAM array. In one aspect, a first terminal of the first MTJ is coupled to the drain electrode of the select transistor in the first MRAM cell, and a second terminal of the first MTJ is coupled to the first bit line, such that the first MRAM cell is configured as an OTP cell and stores an OTP bit value. In a further aspect, a first terminal of the second MTJ is coupled to the drain electrode of the select transistor in the second MRAM cell, and a second terminal of the second MTJ is not connected to the second bit line, such the second MRAM cell is configured as a non-storing cell which is not capable of storing any bit value. In yet a further aspect, a second row along a second word line of the MRAM array is configured as a non-OTP row in which each MRAM cell in the non-OTP row is capable of storing a bit value, such that the second row is configured to store more bit values than the first row. In an even further aspect, the write circuitry is configured to, during a write to a selected MRAM cell in the non-OTP row, connect a bit line coupled to the selected MRAM cell to the first voltage supply terminal and a source line coupled to the selected MRAM cell to the second voltage supply terminal such that only a select transistor in the selected MRAM cell drives write current through an MTJ of the selected MRAM cell to store a logic value in selected MRAM cell. In another aspect of the embodiment, a third MRAM cell in a third column of the OTP row, different from each of the first and second columns, is connected to the first MRAM cell, wherein a source electrode of a select transistor in the third MRAM cell is connected to a third source line corresponding to the third column, a drain electrode of the select transistor in the third MRAM cell is connected to drain electrodes of the select transistors in the first and second MRAM cells, and a third MTJ of the third MRAM cell is not connected to a third bit line corresponding to the third column. In a further aspect, during the write to the first MRAM cell, the first bit line, the second bit line, and the third bit line are connected to the first voltage supply terminal and the first source line, the second source line, and the third source line are connected to the second voltage supply terminal such that the select transistors in the first, second, and third MRAM cells are connected in parallel with each other to drive the write current through the first MTJ. In another aspect of the embodiment, during a write to the first MRAM cell, no current is provided through the second MTJ. In yet another aspect, the first MTJ includes a corresponding free layer and a corresponding tunnel dielectric layer, and when the first MRAM cell is selected for an OTP write operation, the write circuitry and row decoder are configured to place a sufficiently high voltage magnitude across the first MTJ so as to permanently blow the corresponding tunnel dielectric layer of the first MRAM cell to permanently store a logic value. In a further aspect, when the first MRAM cell is selected for a non-OTP write operation, the write circuitry and row decoder are configured to place a lower write voltage magnitude across the first MTJ to set a magnetization of the corresponding free layer of the first MRAM cell to be written to a resistive state to store a logic value in the first MRAM cell, without blowing the corresponding tunnel dielectric layer of the first MRAM cell. In another aspect, the MRAM further includes a column decoder configured to, during a write operation to a selected MRAM cell of the first row, electrically tie multiple bit lines of different columns and electrically tie multiple source lines of different columns. In another aspect, each MRAM cell configured as an OTP cell in the OTP row is connected to a corresponding MRAM cell configured as a non-storing cell in the OTP row whose MTJ is not enabled to store a bit value. In a further aspect, in the OTP row, a drain electrode of a select transistor in any OTP cell is electrically connected to a drain electrode of a select transistor in the corresponding non-storing cell. In yet a further aspect, in the OTP row, a select transistor in any OTP cell operates in parallel with a select transistor in the corresponding non-storing cell to drive a write current through an MTJ of the OTP cell.

In another embodiment, a magnetoresistive random access memory (MRAM) includes an MRAM array having a plurality of word lines and a plurality of bit lines, including a first bit line and a second bit line, wherein an intersection of each word line and column line has a corresponding bit cell, and having a first bit cell corresponding to the intersection of the first word line and a first bit line, a second bit cell corresponding to the intersection of the first word line and the second bit line, and a third bit cell at the intersection of a second word line and the second bit line, wherein drain electrodes of select transistors in the first and second bit cells are connected and the first bit cell is configured as a one-time programmable (OTP) cell which permanently stores a logic value, the second bit cell is disabled from storing any bit value, and the third bit cell is configured as a non-OTP cell; and a column decoder coupled to a first group of bit lines of the plurality of bit lines, the first group including the first and second bit lines, and configure to provide a first write bit line at an output of the column decoder corresponding to the first group of bit lines. For a write operation to the OTP cell, the column decoder is configured to connect both the first and second bit lines of the first group to the output to provide as the first write bit line, and for a write operation to the non-OTP cell, the column decoder is configured to connect only the second bit line of the first group to the output to provide as the first write bit line. In one aspect of the another embodiment, during the write operation to the OTP cell, select transistors in both the first and second bit cells are coupled in parallel to drive a write current through a Magnetic Tunnel Junction (MTJ) of the OTP cell and not through an MTJ of the second bit cell. In a further aspect, the MRAM further includes write circuitry coupled to the first write bit line, wherein the write circuitry is configured to: for the write operation to the non-OTP cell, set the first write bit line and thus the first bit line to a first voltage supply terminal to store a logic value corresponding to a high resistive state or a low resistive state to the non-OTP cell, and, for the write operation to the OTP cell, when the write operation is intended to permanently blow the MTJ of the OTP cell, set the first write bit line and thus both the first and the second bit lines to a second voltage supply terminal which supplies a higher supply voltage than a supply voltage supplied by the first voltage supply terminal. In yet a further embodiment, the write circuitry is further configured to, for the write operation to the OTP cell, when the write operation is not intended to permanently blow the MTJ of the OTP cell, set the first write bit line and thus both the first and the second bit lines to the first voltage supply terminal to store a logic value corresponding to the high resistive state or the low resistive state to the OTP cell. In another aspect, the MRAM array includes a fourth bit cell corresponding to the intersection of the first word line and a third bit line of the plurality of bit lines, wherein a drain electrode of a select transistor of the fourth bit cell is electrically connected to drain electrodes of the select transistors in the first and second bit cells, wherein the first group of bit lines includes the third bit line, and the column decoder, for the write operation to the OTP cell, is configured to connect the first, second, and third bit lines of the first group to the output to provide as the first write bit line, such that select transistors in the first, second, and third bit cells are coupled in parallel to drive the write current through the MTJ of the OTP cell and not through MTJs of the second and third bit cells. In another aspect of the another embodiment, the MRAM array includes a plurality of source lines corresponding to the plurality of bit lines, wherein the first bit cell includes a first select transistor and a first MTJ, wherein a source electrode of the first select transistor is coupled to a first source line corresponding to the first bit line, a control electrode of the first select transistor is coupled to the first word line, a drain electrode of the first select transistor is coupled to a first terminal of the first MTJ, and a second terminal of the first MTJ is coupled to the first bit line, and the second bit cell comprises a second select transistor and a second MTJ, wherein a source electrode of the second select transistor is coupled to a second source line corresponding to the second bit line, a control electrode of the second select transistor is coupled to the first word line, and a drain electrode of the second select transistor is to a first terminal of the second MTJ, and a second terminal of the second MTJ is not coupled to the second bit line.

What is claimed is:

1. A magnetoresistive random access memory (MRAM) comprising:
   an MRAM array including MRAM cells arranged in rows and columns, each row having a corresponding word line and each column having a corresponding bit line and a corresponding source line, wherein an intersection of each row and column has a corresponding MRAM cell, wherein each corresponding MRAM cell includes a select transistor and a Magnetic Tunnel Junction (MTJ), wherein:
      a first row along a first word line of the MRAM array is configured as a single one-time-programmable (OTP) row, and
      a first MRAM cell in a first column of the OTP row is connected to a second MRAM cell in a second column of the OTP row, different from the first column, wherein:
         a source electrode of a select transistor in the first MRAM cell is connected to a first source line corresponding to the first column, and a source electrode of a select transistor in the second MRAM cell is connected to a second source line corresponding to the second column,
         drain electrodes of the select transistors in the first and second MRAM cells are electrically connected to each other,
         a first MTJ of the first MRAM cell is connected to a first bit line corresponding to the first column, and a second MTJ of the second MRAM cell is not connected to a second bit line corresponding to the second column;
   write circuitry coupled to the bit lines of the MRAM array, wherein during a write to the first MRAM cell, the write circuitry is configured to connect the first bit line and the second bit line to a first voltage supply terminal and the first source line and the second source line to a second voltage supply terminal such that the select transistors in the first and second MRAM cells are connected in parallel with each other to drive a write current through the first MTJ; and
   a row decoder coupled to word lines of the MRAM array.

2. The MRAM of claim 1, wherein a first terminal of the first MTJ is coupled to the drain electrode of the select transistor in the first MRAM cell, and a second terminal of the first MTJ is coupled to the first bit line, such that the first MRAM cell is configured as an OTP cell and stores an OTP bit value.

3. The MRAM of claim 2, wherein, a first terminal of the second MTJ is coupled to the drain electrode of the select transistor in the second MRAM cell, and a second terminal of the second MTJ is not connected to the second bit line, such the second MRAM cell is configured as a non-storing cell which is not capable of storing any bit value.

4. The MRAM of claim 3, wherein a second row along a second word line of the MRAM array is configured as a non-OTP row in which each MRAM cell in the non-OTP row is capable of storing a bit value, such that the second row is configured to store more bit values than the first row.

5. The MRAM of claim 4, wherein the write circuitry is configured to, during a write to a selected MRAM cell in the non-OTP row, connect a bit line coupled to the selected MRAM cell to the first voltage supply terminal and a source line coupled to the selected MRAM cell to the second voltage supply terminal such that only a select transistor in the selected MRAM cell drives write current through an MTJ of the selected MRAM cell to store a logic value in selected MRAM cell.

6. The MRAM of claim 1, wherein a third MRAM cell in a third column of the OTP row, different from each of the first and second columns, is connected to the first MRAM cell, wherein:
 a source electrode of a select transistor in the third MRAM cell is connected to a third source line corresponding to the third column,
 a drain electrode of the select transistor in the third MRAM cell is connected to drain electrodes of the select transistors in the first and second MRAM cells,
 a third MTJ of the third MRAM cell is not connected to a third bit line corresponding to the third column.

7. The MRAM of claim 6, wherein during the write to the first MRAM cell, the first bit line, the second bit line, and the third bit line are connected to the first voltage supply terminal and the first source line, the second source line, and the third source line are connected to the second voltage supply terminal such that the select transistors in the first, second, and third MRAM cells are connected in parallel with each other to drive the write current through the first MTJ.

8. The MRAM of claim 1, wherein during a write to the first MRAM cell, no current is provided through the second MTJ.

9. The MRAM of claim 1, wherein the first MTJ includes a corresponding free layer and a corresponding tunnel dielectric layer, and when the first MRAM cell is selected for an OTP write operation, the write circuitry and row decoder are configured to place a sufficiently high voltage magnitude across the first MTJ so as to permanently blow the corresponding tunnel dielectric layer of the first MRAM cell to permanently store a logic value.

10. The MRAM of claim 9, wherein when the first MRAM cell is selected for a non-OTP write operation, the write circuitry and row decoder are configured to place a lower write voltage magnitude across the first MTJ to set a magnetization of the corresponding free layer of the first MRAM cell to be written to a resistive state to store a logic value in the first MRAM cell, without blowing the corresponding tunnel dielectric layer of the first MRAM cell.

11. The MRAM of claim 1, further comprising:
 a column decoder configured to, during a write operation to a selected MRAM cell of the first row, electrically tie multiple bit lines of different columns and electrically tie multiple source lines of different columns.

12. The MRAM of claim 1, wherein each MRAM cell configured as an OTP cell in the OTP row is connected to a corresponding MRAM cell configured as a non-storing cell in the OTP row whose MTJ is not enabled to store a bit value.

13. The MRAM of claim 12, wherein, in the OTP row, a drain electrode of a select transistor in any OTP cell is electrically connected to a drain electrode of a select transistor in the corresponding non-storing cell.

14. The MRAM of claim 13, wherein, in the OTP row, a select transistor in any OTP cell operates in parallel with a select transistor in the corresponding non-storing cell to drive a write current through an MTJ of the OTP cell.

15. A magnetoresistive random access memory (MRAM) comprising:
 an MRAM array having a plurality of word lines and a plurality of bit lines, including a first bit line and a second bit line, wherein an intersection of each word line and column line has a corresponding bit cell, and having a first bit cell corresponding to the intersection of the first word line and a first bit line, a second bit cell corresponding to the intersection of the first word line and the second bit line, and a third bit cell at the intersection of a second word line and the second bit line, wherein drain electrodes of select transistors in the first and second bit cells are connected and the first bit cell is configured as a one-time programmable (OTP) cell which permanently stores a logic value, the second bit cell is disabled from storing any bit value, and the third bit cell is configured as a non-OTP cell;
 a column decoder coupled to a first group of bit lines of the plurality of bit lines, the first group including the first and second bit lines, and configure to provide a first write bit line at an output of the column decoder corresponding to the first group of bit lines, wherein:
 for a write operation to the OTP cell, the column decoder is configured to connect both the first and second bit lines of the first group to the output to provide as the first write bit line, and
 for a write operation to the non-OTP cell, the column decoder is configured to connect only the second bit line of the first group to the output to provide as the first write bit line.

16. The MRAM of claim 15, wherein during the write operation to the OTP cell, select transistors in both the first and second bit cells are coupled in parallel to drive a write current through a Magnetic Tunnel Junction (MTJ) of the OTP cell and not through an MTJ of the second bit cell.

17. The MRAM of claim 16, further comprising:
 write circuitry coupled to the first write bit line, wherein the write circuitry is configured to:
 for the write operation to the non-OTP cell, set the first write bit line and thus the first bit line to a first voltage supply terminal to store a logic value corresponding to a high resistive state or a low resistive state to the non-OTP cell, and
 for the write operation to the OTP cell, when the write operation is intended to permanently blow the MTJ of the OTP cell, set the first write bit line and thus both the first and the second bit lines to a second voltage supply terminal which supplies a higher supply voltage than a supply voltage supplied by the first voltage supply terminal.

18. The MRAM of claim 17, wherein the write circuitry is further configured to:
 for the write operation to the OTP cell, when the write operation is not intended to permanently blow the MTJ of the OTP cell, set the first write bit line and thus both the first and the second bit lines to the first voltage supply terminal to store a logic value corresponding to the high resistive state or the low resistive state to the OTP cell.

19. The MRAM of claim 17, wherein the MRAM array includes a fourth bit cell corresponding to the intersection of the first word line and a third bit line of the plurality of bit lines, wherein a drain electrode of a select transistor of the fourth bit cell is electrically connected to drain electrodes of the select transistors in the first and second bit cells, wherein the first group of bit lines includes the third bit line, and the column decoder, for the write operation to the OTP cell, is configured to connect the first, second, and third bit lines of the first group to the output to provide as the first write bit line, such that select transistors in the first, second, and third bit cells are coupled in parallel to drive the write current through the MTJ of the OTP cell and not through MTJs of the second and third bit cells.

20. The MRAM of claim 15, wherein the MRAM array includes a plurality of source lines corresponding to the plurality of bit lines, wherein the first bit cell comprises:

a first select transistor and a first MTJ, wherein a source electrode of the first select transistor is coupled to a first source line corresponding to the first bit line, a control electrode of the first select transistor is coupled to the first word line, a drain electrode of the first select transistor is coupled to a first terminal of the first MTJ, and a second terminal of the first MTJ is coupled to the first bit line, and the second bit cell comprises a second select transistor and a second MTJ, wherein a source electrode of the second select transistor is coupled to a second source line corresponding to the second bit line, a control electrode of the second select transistor is coupled to the first word line, and a drain electrode of the second select transistor is to a first terminal of the second MTJ, and a second terminal of the second MTJ is not coupled to the second bit line.

* * * * *